US012774097B2

(12) United States Patent
Zuzelski et al.

(10) Patent No.: US 12,774,097 B2
(45) Date of Patent: Oct. 27, 2026

(54) SYSTEM AND METHOD FOR GENERATING ELECTRICAL ENERGY FROM THERMAL WASTE ENERGY AND REMOVING THERMAL WASTE ENERGY IN AN AIRCRAFT

(71) Applicant: Eaton Intelligent Power Limited, Dublin (IE)

(72) Inventors: Chris Zuzelski, Clarklake, MI (US); Christopher Cantrell, Jackson, MI (US); William Hank Newsome, Dexter, MI (US)

(73) Assignee: Eaton Intelligent Power Limited, Dublin (IE)

( * ) Notice: Subject to any disclaimer, the term of this patent is extended or adjusted under 35 U.S.C. 154(b) by 340 days.

(21) Appl. No.: 18/548,685

(22) PCT Filed: Mar. 4, 2022

(86) PCT No.: PCT/EP2022/025081
§ 371 (c)(1),
(2) Date: Sep. 1, 2023

(87) PCT Pub. No.: WO2022/184325
PCT Pub. Date: Sep. 9, 2022

(65) Prior Publication Data

US 2024/0166358 A1 May 23, 2024

Related U.S. Application Data

(60) Provisional application No. 63/157,478, filed on Mar. 5, 2021.

(51) Int. Cl.
*B64D 15/12* (2006.01)
*H10N 10/13* (2023.01)

(52) U.S. Cl.
CPC ............ *B64D 15/12* (2013.01); *H10N 10/13* (2023.02)

(58) Field of Classification Search
None
See application file for complete search history.

(56) References Cited

U.S. PATENT DOCUMENTS 8,127,555 B2 3/2012 Jarmon et al.
8,944,367 B2 2/2015 Bystry, Jr. et al.
(Continued)

FOREIGN PATENT DOCUMENTS

CN 104092409 A 10/2014
EP 2662285 A1 11/2013
(Continued)

OTHER PUBLICATIONS

International Search Report and Written Opinion of the International Searching Authority for International Patent Application No. PCT/EP2022/025081 mailed May 24, 2022, 14 pages.

*Primary Examiner* — Dustin Q Dam
(74) *Attorney, Agent, or Firm* — Merchant & Gould P.C.

(57) ABSTRACT

A system for generating electrical energy from thermal waste energy and removing thermal waste energy in an aircraft is provided. The system includes a thermal management circuit configured to channel a flow of coolant fluid that collects thermal waste energy from a thermal energy generating component. A heat exchanger coupled in fluid communication with the thermal management circuit and downstream from the thermal energy generating component. The heat exchanger is coupled in thermal contact to an exterior skin wall and adapted to transfer thermal energy from the flow of coolant fluid to the exterior skin wall. A thermoelectric generator is configured to convert heat flux between the flow of coolant fluid within the heat exchanger and atmosphere surrounding an outside surface of the exte- (Continued)

rior skin wall into electrical energy. The thermoelectric generator includes thermo-electric interface material extending between an inside surface of the exterior skin wall and the heat exchanger.

20 Claims, 6 Drawing Sheets

(56) References Cited

U.S. PATENT DOCUMENTS

| | | | |
|---|---|---|---|
| 9,027,635 | B2 | 5/2015 | Wittmer et al. |
| 9,048,689 | B2 | 6/2015 | Bosson et al. |
| 9,666,781 | B2 | 5/2017 | Mitchell et al. |
| 10,291,156 | B2 | 5/2019 | Wang |
| 2015/0047684 | A1 | 2/2015 | Mitchell et al. |
| 2019/0100319 | A1 | 4/2019 | Mackin |

FOREIGN PATENT DOCUMENTS

| | | | |
|---|---|---|---|
| EP | 3750810 | A1 | 12/2020 |
| FR | 3098495 | A1 | 1/2021 |
| GB | 2447333 | A | 9/2008 |
| JP | 2001183026 | A | 7/2001 |

SYSTEM AND METHOD FOR GENERATING ELECTRICAL ENERGY FROM THERMAL WASTE ENERGY AND REMOVING THERMAL WASTE ENERGY IN AN AIRCRAFT

CROSS-REFERENCE TO RELATED APPLICATIONS

This application is a National Stage Application of PCT/EP2022/025081, filed Mar. 4, 2022, which claims the benefit of U.S. Provisional Patent Application No. 63/157,478, filed Mar. 5, 2021, the entire disclosures of which are incorporated herein by reference in their entireties. To the extent appropriate, a claim of priority is made to each of the above disclosed applications.

BACKGROUND

The present disclosure relates generally to heat exchangers and thermoelectric generators for aircrafts, and to systems and methods for generating electrical energy from thermal waste energy and removing thermal waste energy in aircrafts that is useable for de-icing.

During ascent and decent operations of aircrafts, control and propulsion surfaces can require de-icing and/or anti-icing below a predetermined altitude so as to reduce or prevent ice buildup on exterior surfaces of the aircraft. Some known de-icing and/or anti-icing techniques include using bleed air from turbine engines to heat the control and propulsion surfaces. Other known de-icing and/or anti-icing techniques include using electric heating at the control and propulsion surfaces. However, both of these ice reducing techniques are a parasitic drain on other systems when in operation (e.g., compressed air from the turbine engine or larger generators producing electric power). Additionally, both of these ice reducing techniques are independent systems that are only used for de-icing and/or anti-icing, and de-icing and/or anti-icing is not required for the entire flight cycle of the aircraft. It is desirable to improve efficiency and performance of aircrafts.

SUMMARY

Aspects of the present disclosure relate to a system for generating electrical energy from thermal waste energy and removing thermal waste energy in an aircraft, the system including: at least one thermal management circuit configured to channel a flow of coolant fluid that collects thermal waste energy from one or more thermal energy generating components on the aircraft; one or more heat exchangers coupled in fluid communication with the at least one thermal management circuit and downstream from the one or more thermal energy generating components, wherein the one or more heat exchangers are coupled in thermal contact to an exterior skin wall of the aircraft and adapted to transfer thermal energy from the flow of coolant fluid to the exterior skin wall for removal from the at least one thermal management circuit; and a thermoelectric generator configured to convert heat flux between the flow of coolant fluid within the one or more heat exchangers and atmosphere surrounding an outside surface of the exterior skin wall into electrical energy, wherein the thermoelectric generator includes thermoelectric interface material extending between an inside surface of the exterior skin wall and the one or more heat exchangers.

The system may also include one or more of the following features individually or in non-exclusive combinations. In an example, an electric heater is coupled in thermal contact to the exterior skin wall. In another example, the electric heater is disposed between the one or more heat exchangers and the inside surface of the exterior skin wall. In still another example, an insulating material layer is included, the one or more heat exchangers and the thermoelectric generator being disposed between the insulating material layer and the inside surface of the exterior skin wall. In yet another example, the exterior skin wall of the aircraft is a leading surface of one or more control or propulsion surfaces of the aircraft.

In an example, thermoelectric generator further includes a thermoelectric module formed by the thermoelectric interface material and adapted to directly generate the electrical energy from the heat flux within the thermoelectric interface material, the thermoelectric module coupled to an electrical power circuit of the aircraft. In another example, the thermoelectric module is coupled to the electrical power circuit via integrated or printed electronic wiring. In still another example, an electric heater is coupled in thermal contact to the exterior skin wall and operably coupled to the electrical power circuit.

In another aspect, the technology relates to an aircraft including: an exterior skin wall including an inside surface and an outside surface; one or more thermal energy generating components; at least one thermal management circuit configured to channel a flow of coolant fluid and collect thermal waste energy from the one or more thermal energy generating components; one or more heat exchangers coupled in thermal contact to the exterior skin wall and coupled in fluid communication with the at least one thermal management circuit downstream from the one or more thermal energy generating components, wherein the one or more heat exchangers are adapted to transfer thermal energy from the flow of coolant fluid to the exterior skin wall for removal from the at least one thermal management circuit; and a thermoelectric generator including thermoelectric interface material extending between the inside surface of the exterior skin wall and the one or more heat exchangers, wherein the thermoelectric generator is configured to convert heat flux between the flow of coolant fluid within the one or more heat exchangers and atmosphere surrounding the outside surface of the exterior skin wall into electrical energy for the aircraft.

The aircraft may also include one or more of the following features individually or in non-exclusive combinations. In an example, an electric heater is coupled in thermal contact to the exterior skin wall. In another example, the electric heater is disposed between the one or more heat exchangers and the inside surface of the exterior skin wall. In still another example, an insulating material layer is included, wherein the one or more heat exchangers and the thermoelectric generator being disposed between the insulating material layer and the inside surface of the exterior skin wall. In yet another example, the exterior skin wall is a leading surface of one or more control or propulsion surfaces of the aircraft.

In an example, an electrical power circuit is included, the thermoelectric generator further includes a thermoelectric module formed from the thermoelectric interface material, the thermoelectric module is coupled to the electrical power circuit and adapted to directly generate the electrical energy from the heat flux within the thermoelectric interface material. In another example, an electric heater is coupled in thermal contact to the exterior skin wall and operably coupled to the electrical power circuit. In still another example, the at least one thermal management circuit includes tubing for the flow of coolant fluid, and at least a portion of the tubing between the one or more thermal energy generating components and the one or more heat exchangers is routed along at least a portion of one or more of a ducted shroud, a pylon, and a wing of the aircraft and thermally coupled thereto.

In another aspect, the technology relates to a method of generating electrical energy from thermal waste energy and removing thermal waste energy in an aircraft, the method including: collecting thermal waste energy from one or more thermal energy generating components on the aircraft in a flow of coolant fluid; channeling the flow of coolant fluid towards one or more heat exchangers downstream of the one or more thermal energy generating components, wherein the one or more heat exchangers are coupled in thermal contact to an exterior skin wall of the aircraft; removing thermal energy from the flow of coolant fluid at the one or more heat exchangers by transferring thermal energy from the flow of coolant fluid to the exterior skin wall; and converting heat flux between the flow of coolant fluid and atmosphere surrounding an outside surface of the exterior skin wall to electrical energy via a thermoelectric generator, wherein the thermoelectric generator includes thermoelectric interface material extending between an inside surface of the exterior skin wall and the one or more heat exchangers.

The method may also include one or more of the following features individually or in non-exclusive combinations. In an example, the method can include reducing or preventing ice formation at the exterior skin wall by transferring thermal energy from the flow of coolant fluid to the exterior skin wall. In another example, reducing or preventing ice formation at the exterior skin wall also includes heating the exterior skin wall by an electric heater coupled in thermal contact to the exterior skin wall. In still another example, the step of transferring thermal energy from the flow of coolant fluid to the exterior skin wall and the step of heating the exterior skin wall by the electric heater occur concurrently. In yet another example, the method can include transferring the electrical energy from the thermoelectric generator to an electrical power circuit of the aircraft. In an example, the method can include insulating the one or more heat exchangers at the exterior skin wall of the aircraft.

In another aspect the technology relates to a system for reducing ice formation on an aircraft, the system including: at least one thermal management circuit configured to channel a flow of coolant fluid that collects thermal waste energy from one or more thermal energy generating components on the aircraft; one or more heat exchangers coupled in fluid communication with the at least one thermal management circuit and downstream from the one or more thermal energy generating components, wherein the one or more heat exchangers are coupled in thermal contact to an exterior skin wall of the aircraft and adapted to transfer thermal energy from the flow of coolant fluid to the exterior skin wall for removal from the at least one thermal management circuit, and wherein the aircraft is configured to operate in a ice reduction configuration that uses the transfer of thermal energy from the flow of coolant to reduce or prevent ice formation at the exterior skin wall; and a thermoelectric generator configured to convert heat flux between the flow of coolant fluid within the one or more heat exchangers and atmosphere surrounding an outside surface of the exterior skin wall into electrical energy, wherein the thermoelectric generator comprises thermoelectric interface material extending between an inside surface of the exterior skin wall and the one or more heat exchangers.

The system may also include one or more of the following features individually or in non-exclusive combinations. In an example, an electric heater is coupled in thermal contact to the exterior skin wall, wherein the electric heater is configured to augment the reduction or prevention of ice formation at the exterior skin wall. In another example, the thermoelectric generator further includes a thermoelectric module formed by the thermoelectric interface material and adapted to directly generate the electrical energy from the heat flux within the thermoelectric interface material, the thermoelectric module coupled to the electric heater. In still another example, the exterior skin wall of the aircraft is a leading surface of one or more control or propulsion surfaces of the aircraft. In yet another example, the ice reduction configuration occurs during ascent and descent operations of the aircraft, and wherein outside of the ice reduction configuration, the transfer of thermal energy from the flow of coolant dissipates heat from the at least one thermal management circuit.

A variety of additional inventive aspects will be set forth in the description that follows. The inventive aspects can relate to individual features and to combinations of features. It is to be understood that both the forgoing general description and the following detailed description are exemplary and explanatory only and are not restrictive of the broad inventive concepts upon which the examples disclosed herein are based.

BRIEF DESCRIPTION OF THE DRAWINGS

The accompanying drawings, which are incorporated in and constitute a part of the description, illustrate several aspects of the present disclosure. A brief description of the drawings is as follows.

DETAILED DESCRIPTION

The systems and methods describe herein have features that capture thermal waste energy from thermal energy generating components on an aircraft and use the thermal waste energy to provide electric power generation and heat dissipation. Additionally, the heat dissipation functionality can be used to reduce icing on the aircraft as required or desired. As such, aircraft efficiency and performance are increased. The system includes a heat exchanger that is thermally coupled to an exterior skin wall of the aircraft. The heat exchanger is coupled to a thermal management circuit that captures the thermal waste energy and transfers it to the heat exchanger. In an aspect, a coolant fluid is used to cool the thermal energy generating components and capture the thermal waste energy. At the heat exchanger, the thermal waste energy is dissipated from the coolant fluid to the atmosphere and removed from the circuit.

Because this dissipation of thermal waste energy heats an outside surface of the exterior skin wall, the heat exchanger can be disposed at locations on the aircraft that require anti-icing and/or de-icing during ascent and descent operations of the aircraft below predetermine altitudes. For example, the heat exchanger is located at leading edge portions of the exterior skin wall and at control or propulsion surfaces of the aircraft. In contrast to known existing anti-icing and/or de-icing systems (e.g., bleed air systems and electronic heat systems), by using thermal waste energy, a dedicated and independent ice reducing system that may not be utilized for the entire flight cycle is reduced or eliminated. Thus, aircraft weight and parasitic loads on engines and generators are reduced, and aircraft efficiency and performance are increased.

Additionally, the heat flux between the heat exchanger with the heated coolant fluid and the exterior skin wall exposed to the atmosphere is relatively consistent, and as such, the system includes a thermoelectric generator that is used to generate electric power for the aircraft. The thermoelectric generator can be used for most of, or the entire, flight cycle to augment the electric power sources on the aircraft and reduce the size thereof. Thereby, also increasing aircraft efficiency and performance of the aircraft. Accordingly, the systems and methods described herein are configured to capture waste heat from the aircraft and repurpose the waste heat to reduce the power draw from a battery required to reduce icing of aircraft surfaces and reduce the heat load on radiators resulting in a reduction of size, and thereby, a reduction of total aircraft weight.

Figure 1:
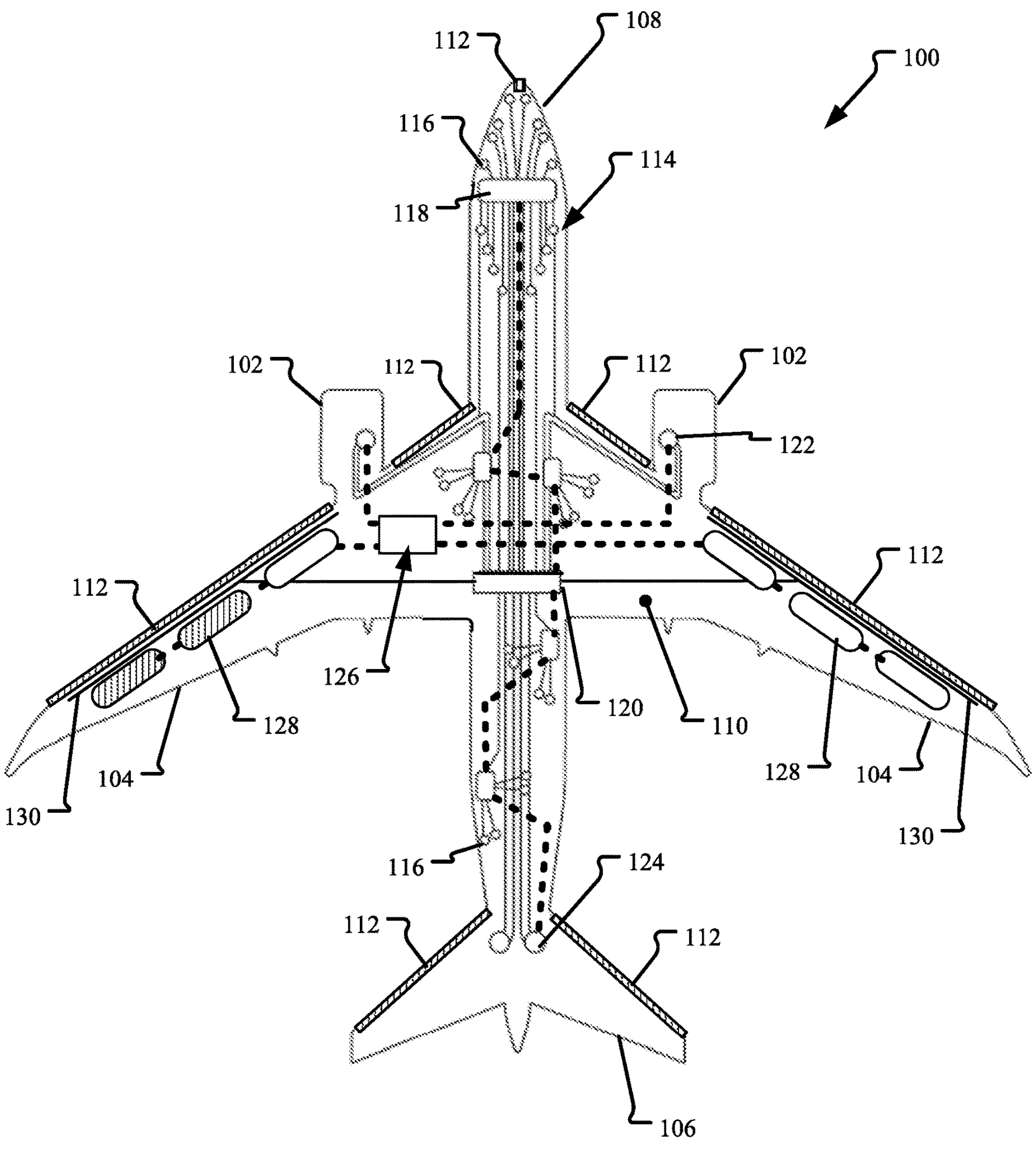
FIG. 1 is a schematic view of an exemplary aircraft.

FIG. 1 is a schematic view of an aircraft 100. The aircraft 100 includes one or more engines 102, for example, a gas turbine, disposed on wings 104. Additionally, a tail 106 is disposed at the tail end of the aircraft 100 opposite a nose end 108. The aircraft 100 has an exterior skin wall 110 that is exposed to the atmosphere. Portions of the exterior skin wall 110 form leading edges 112 of the aircraft 100 in relation to the direction of travel. These leading edges 112 can be formed on one or more aerodynamic control or propulsion surfaces (e.g., wings 104, tail 106, nose 108, pylons, ducted shrouds, etc.) that require anti-icing and/or de-icing during ascent and decent operations of the aircraft 100 and below a predetermined altitude. As used herein, anti-icing may refer to reducing or preventing the creation of ice on the surface of the aircraft, while de-icing may refer to reducing (e.g., melting) ice already formed on the surface of the aircraft. Generally, the icing system described herein may be utilized for anti-icing and/or de-icing functions as required or desired.

As illustrated in FIG. 1, the aircraft 100 is a commercial airplane with gas turbine engines. It should be appreciated that the systems and devices described herein can be used in any other type of aircraft as required or desired. For example, military aircrafts, rotorcrafts (e.g., helicopters), unpowered aircrafts such as gliders, propeller aircrafts, electric aircrafts, and the like. In an aspect, the aircraft 100 may be a vertical take-off and landing (VTOL) aircraft and the leading edges 112 can include, but are not limited to, the leading edges of pylon and wing surfaces, and/or a ducted shroud.

The aircraft 100 also includes an electrical power circuit 114 which generates, controls, and distributes power to electrical loads 116 on the aircraft 100. The electrical loads 116 can be any component on the aircraft 100 that requires electrical power to operate, such as, but not limited to, avionics equipment, flight deck displays, flight controls, in-flight entertainment, power distribution units, pumps, motors, mechanical devices, and the like. Furthermore, as more and more electrical components are utilized on aircrafts, the required electrical power required to operate the aircraft 100 is ever increasing. The various components of the electrical power circuit 114 can be serviced by a forward electrical equipment bay 118 and/or an aft electrical equipment bay 120.

In an aspect, the electrical power circuit 114 includes power generators 122 on the engines 102 and one or more auxiliary power units 124 as required or desired to generate power. Additionally, one or more batteries or fuel cells (not shown) can be included to store power. Generally, the electrical power circuit 114 includes multiple layers of redundancy for safe operation of the aircraft 100.

The components powered at the electrical loads 116 generate thermal energy from power consumption that is collected and removed from the electrical power circuit 114. This collected thermal energy is generally considered waste thermal energy and is removed from the aircraft 100. To manage the thermal load of the electrical power circuit 114, the aircraft 100 includes one or more thermal management circuits 126. The thermal management circuit 126 is thermally coupled to the thermal energy generating components in the electrical power circuit 114 such that the thermal waste energy is collected by a flow of coolant fluid past the electrical loads 116. The coolant fluid can be a liquid or a gas fluid. In an aspect, the coolant fluid is a liquid, such as, ethylene glycol and water, propylene glycol and water, polyalphaolefin, and the like. The thermal management circuit 126 can include any number of components that enable coolant fluid to be channeled therethrough for collecting and managing thermal waste energy, such as, but not limited to, piping, pumps, valves, reservoirs, and the like.

In the example, one or more heat exchangers 128 are coupled in fluid communication with the thermal management circuit 126. The heat exchangers 128 are coupled in thermal contact with the exterior skin wall 110 of the aircraft 100 and are adapted to transfer thermal energy from the coolant fluid to the exterior skin wall 110 for removal from the thermal management circuit 126 and dissipation into the atmosphere. In an aspect, the heat exchangers 128 are disposed adjacent to one or more of the leading edges 112 of the aircraft 100. In this location, the heat exchangers 128 and the thermal management circuit 126 can be used to reduce or prevent ice formation during ascent and descent operations of the aircraft 100. That is, when required or desired the transfer of thermal energy from the heated coolant fluid flow towards the exterior skin wall 110 and the cooler atmospheric side is utilized to de-ice and/or anti-ice the exterior skin wall 110 and reduce or prevent ice from forming on its outside surface. It should be appreciated, that the heat exchangers 128 can be located in other areas of the aircraft 100 and utilized to dissipate thermal energy from the thermal management circuit 126 without functioning as a de-icing and/or anti-icing component as required or desired.

As illustrated in FIG. 1, the thermal management circuit 126 is thermally coupled to the electrical power circuit 114. It should be appreciated, that the thermal management circuit 126 can additionally, or alternatively, be coupled in thermal communication to any other circuit within the aircraft 100 that has components that generate thermal energy. For example, heat for the heat exchangers 128 can be collected from a hydraulic circuit (not shown), a fuel circuit (not shown), an engine circuit (not shown), or any other circuit within the aircraft 100. By using the thermal management circuit 126 to de-ice and/or anti-ice the leading edges 112, a separate dedicated ice reducing system is not necessary needed (e.g., a bleed air de-icing system or an electric heating system), or the size of the separate ice reducing system can be reduced, thereby increasing aircraft efficiencies and performance by reducing parasitic loads on engines and reducing weight.

In some aspects, the heat exchangers 128 may be separated into zones within the aircraft 100 such that the heated coolant fluid within the thermal management circuit 126 is concentrated in specific areas as required or desired. Additionally or alternatively, at least a portion of the thermal management circuit 126 that is between the thermal generating component and the heat exchanger 128 may be routed through tubing that is in contact with at least a portion of the leading edges 112 that are to be de-iced or anti-iced. For example, the tubing for the thermal management circuit 126 may be routed to be in contact with an internal surface of a ducted shroud of the aircraft 100 for de-icing and/or anti-icing and upstream of the heat exchanger 128. In other examples, the tubing may be routed to be in contact with a leading edge of a wing or a pylon. This configuration can decrease the thermal load on the heat exchanger 128, and thereby size, to further increase efficiency and performance of the aircraft 100.

Additionally, between the heat exchangers 128 with the heated coolant fluid and the exterior skin wall 110 exposed to the atmosphere, a high heat flux is present. In the example, this heat flux is captured via a thermoelectric generator 130 and converted into electrical energy. The thermoelectric generator 130 is coupled in electric communication to the electrical power circuit 114 so that the captured electrical energy can be used within the aircraft 100 as required or desired. By generating electrical energy from thermal waste energy, the aircraft is more efficient and power generation units, like the generators 122, can be reduced in size while increasing aircraft performance. The thermoelectric generator 130 can also extend the range of an aircraft and make the aircraft more efficient.

Figure 2:
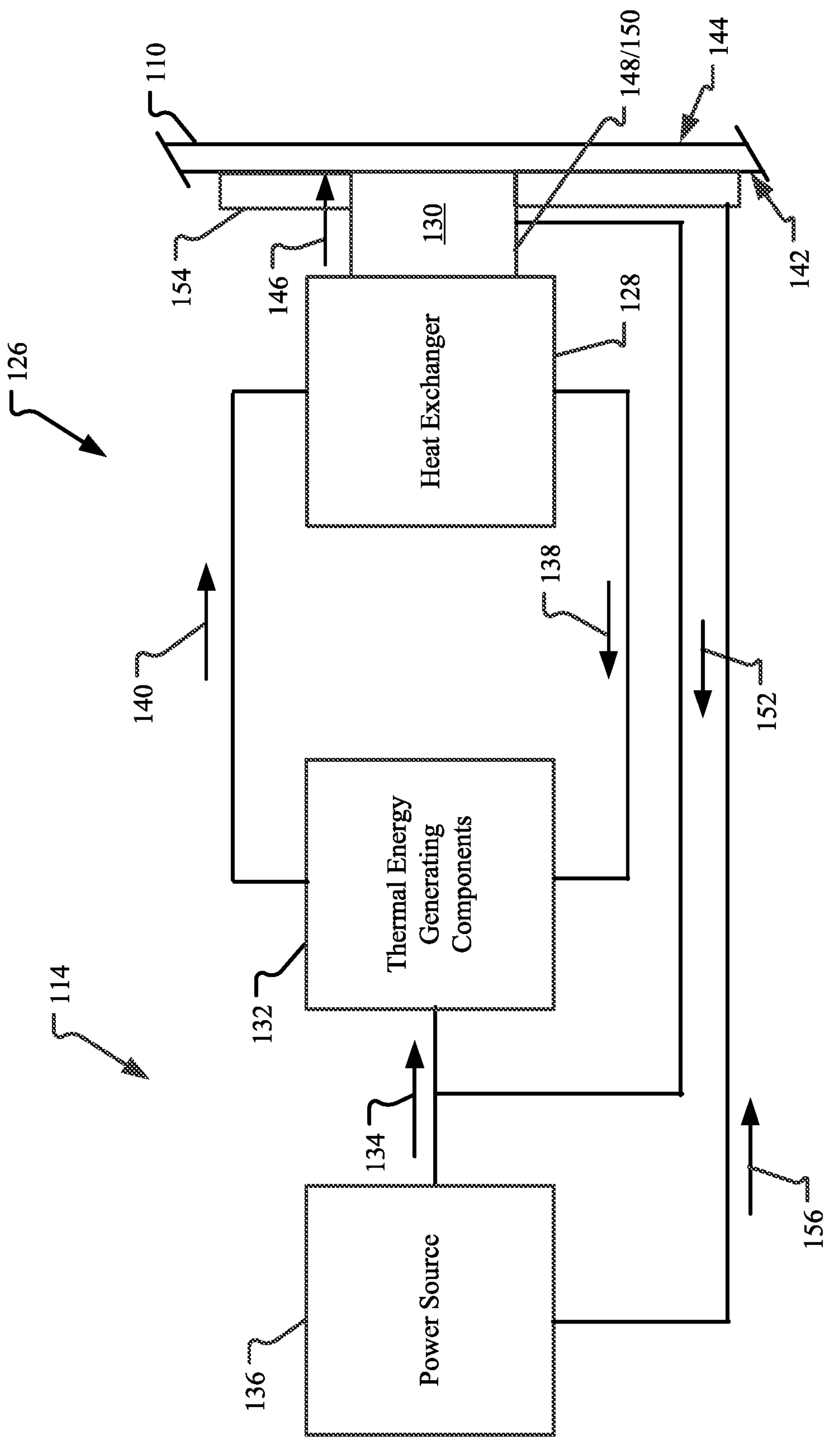
FIG. 2 is a schematic view a thermal management circuit that generates electrical energy from thermal waste energy and also removes the thermal waste energy from the aircraft shown in FIG. 1.

FIG. 2 is a schematic view the thermal management circuit 126 that generates electrical energy from thermal waste energy and also removes the thermal waste energy from the aircraft 100 (shown in FIG. 1). During operation of the aircraft, one or more components 132 draw electric power 134 from a power source 136 within the electrical power circuit 114. These components 132 generate thermal energy in the form of heat that is collected by the thermal management circuit 126. The thermal management circuit 126 is thermally coupled to the component 132 and is configured to channel a coolant fluid 138 that cools the component 132 and collects the waste thermal energy from the component 132. The heated coolant fluid 140 is channeled through one or more heat exchangers 128 that are downstream from the thermal energy generating components 132. The heat exchanger 128 is coupled in thermal contact to the exterior skin wall 110 of the aircraft with an inside surface 142 and an outside surface 144 that is exposed to the atmosphere. This configuration enables thermal waste energy 146 collected within the heated coolant fluid 140 to be dissipated into the atmosphere through the exterior skin wall 110. Additionally, this dissipation of thermal waste energy 146 at the exterior skin wall 110 can facilitate de-icing and/or anti-icing of the outside surface 144 as required or desired.

The heat exchanger 128 can be any type of heat exchanger that enables the thermal waste energy 146 to be dissipated through the exterior skin wall 110 as described herein. For example, the heat exchanger 128 may be a tube-type heat exchanger. In another example, the heat exchanger 128 may be additively manufactured cavities that promote heat transfer. Other heat exchanger types are also contemplated herein.

Additionally, because the atmosphere at the outside surface 144 of the exterior skin wall 110 is lower in temperature than the heated coolant fluid 140, there is heat flux therebetween, and this heat flux is captured by the thermoelectric generator 130. The thermoelectric generator 130 includes thermoelectric interface material 148 that extends between the inside surface 142 of the exterior skin wall 110 and the heat exchanger 128. The thermoelectric interface material 148 is characterized in having both high electrical conductivity and low thermal conductivity. The thermoelectric interface material 148 forms a thermoelectric module 150 that is adapted to directly generate electrical power 152 from the heat flux within the thermoelectric interface material 148. The thermoelectric module 150 is coupled in electric communication with the electrical power circuit 114 so that the electrical power 152 generated therefrom can be used in the aircraft as required or desired. For example, power various aircraft systems while enabling the power source 136 to be downsized. The thermoelectric generator 130 enables for the thermal waste energy 146 to be additionally utilized for generating electrical power 152 for the aircraft.

In some examples, the thermoelectric generator 130 may include a plurality of thermoelectric generators electronically coupled together in parallel or series. To link together the thermoelectric modules 150 of multiple thermoelectric generators 130 and/or couple the thermoelectric generators 130 to the electrical power circuit 114, integrated or printed wiring can be utilized. In an aspect, the thermoelectric generator 130 and the wiring may be applied directly to the inside surface 142 of the exterior skin wall 110 of the aircraft. In another aspect, the thermoelectric generator 130 and wiring can be applied to a flexible decal, sheet, adhesive attachment, or the like that is applied to the inside surface 142 of the exterior skin wall 110 after initial structural fabrication. As described herein, wiring may be considered to mean gaged electrical wire applied or embedded with a structure or sheet, or may additionally or alternatively be printed conductive pathways as required or desired.

Turning back to the de-icing and/or anti-icing functionality of the heat exchanger 128, in some examples, the thermal waste energy 146 may need to be augmented so that the outside surface 144 of the exterior skin wall 110 is heated to a temperature that provides the de-icing and/or anti-icing functionality. In this example, an electric heater 154 can be coupled in thermal contact to the inside surface 142 of the exterior skin wall 110. The electric heater 154 is operably coupled to the electrical power circuit 114 such that electric power 156 is used to heat the exterior skin wall 110. The electric heater 154 can be used concurrently with the heat exchanger 128, and as such, the draw of electric power 156 is lower than when compared to a de-icing and/or anti-icing system that only uses electric heaters. The electric heater 154 can be any type of electric heater 154 that enables the exterior skin wall 110 to de-ice and/or anti-ice as described herein. For example, the electric heater 154 can be a resistive film that is adhered to the inside surface 142. In another example, the electric heater 154 may be resistive coils. Other electric heater configurations are also contemplated herein.

In the example, the electric heater 154 is disposed between the heat exchanger 128 and the inside surface 142 of the exterior skin wall 110. In an aspect, the electric heater 154 and the thermoelectric generator 130 may be in series and side-by-side of one another so that they run parallel with each other along the inside surface 142 of the exterior skin wall 110. In other aspects, the electric heater 154 and the thermoelectric generator 130 may be in a layered configuration with respect to the exterior skin wall 110.

Figure 3:
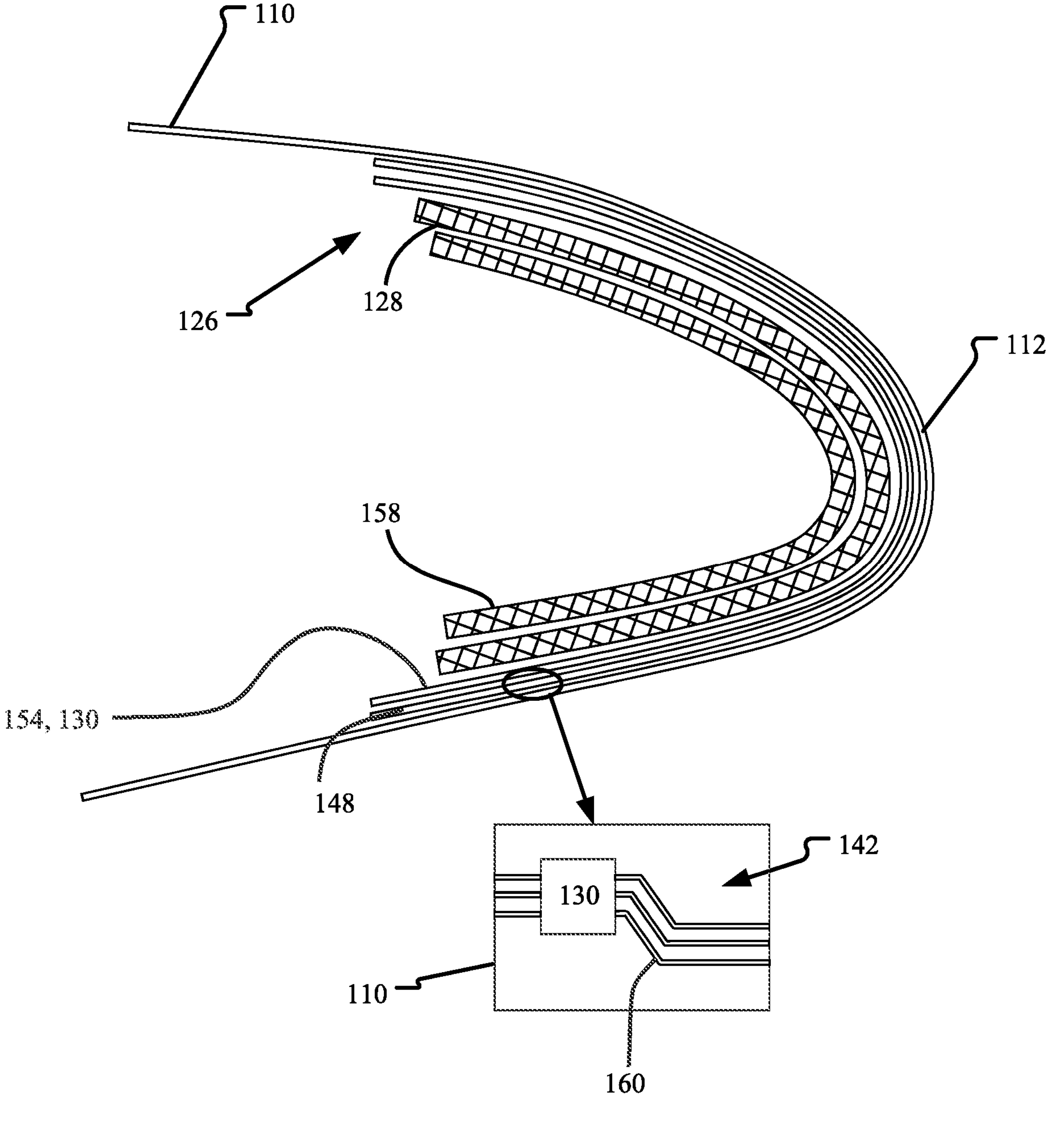
FIG. 3 is a partial cross-sectional view of the thermal management circuit disposed within the aircraft shown in FIG. 1.

FIG. 3 is a partial cross-sectional view of the thermal management circuit 126 disposed within the aircraft 100 (shown in FIG. 1). As illustrated in FIG. 3, the leading edge 112 of the exterior skin wall 110 is shown and is a surface of a control or propulsion component of the aircraft. For example, wings, pylons, nose, tail, ducted shrouds, and/or the like. Adjacent the inside surface of the exterior skin wall 110 is the thermoelectric interface material 148 along with the electric heater 154 and thermoelectric generator 130. Additionally, the heat exchanger 128 is provided, and the heat exchanger 128 can be insulated by an insulating material layer 158. In the example, the heat exchanger 128, the thermoelectric generator 130, and the electric heater 154 are all disposed between the insulating material layer 158 and the exterior skin wall 110. This configuration ensures that the thermal waste energy is directed and dissipates toward the exterior skin wall 110 rather than back into the components of the aircraft. Additionally, the insulating material layer 158 traps heat generated by the electric heater 154 into the exterior skin wall 110 and the generated heat is not distributed towards the components of the aircraft. In an aspect, one or more of the heat exchanger 128, the thermoelectric generator 130, and the electric heater 154 may be contoured to the shape of the exterior skin wall 110.

In operation, both the heat exchanger 128 and the thermoelectric generator 130 utilize the heated coolant fluid as the hot side of the system and the atmosphere outside of the exterior skin wall 110 as the cold side of the system. As such, for both components heat flux is in a direction away from the heat exchanger 128 and towards the exterior skin wall 110. This direction can provide heating for de-icing and/or anti-icing functions and/or general waste thermal energy dissipation to the atmosphere via the heat exchanger 128, and electric power generation via the thermoelectric generator 130. Because aircrafts are using ever-increasing power loads, the thermal management circuit 126 is able to supply a continuous flow of heated coolant fluid to the heat exchanger 128. Additionally, the cooler atmosphere outside of the exterior skin wall 110 is also consistent. As such, the environment between the heat exchanger 128 hot side and the atmospheric cold side is relatively consistent during operation of the aircraft, thereby creating a reliable system for utilizing the thermoelectric generator 130. The thermoelectric generator 130 can also operate during most of or the entire flight cycle of the aircraft.

In some examples, the electric heater 154 and the thermoelectric generator 130 may be an integrated device. As such, the integrated device can generate heat with electrical input, but also generate electricity with heat energy input. Because, de-icing and/or anti-icing is required only during ascending and descending, during most of the operational time of the aircraft the integrated device can be used as a generator producing electrical power. This integrated device also has built in inherent safety redundancy as either the heat exchanger or electric heater can operate independently.

Wiring 160 is used to electronically couple together multiple thermoelectric generators 130 and/or electronically couple the thermoelectric generators 130 to the electrical power circuit. In an aspect, the thermoelectric generator 130 and the wiring 160 may be applied directly to the inside surface 142 of the exterior skin wall 110 of the aircraft. In another aspect, the thermoelectric generator 130 and wiring can be applied to a flexible decal, sheet, adhesive attachment, or the like that is applied to the inside surface 142 of the exterior skin wall 110 after initial structural fabrication. The wiring 160 can be integrated or printed electronic wiring as required or desired.

Figure 4:
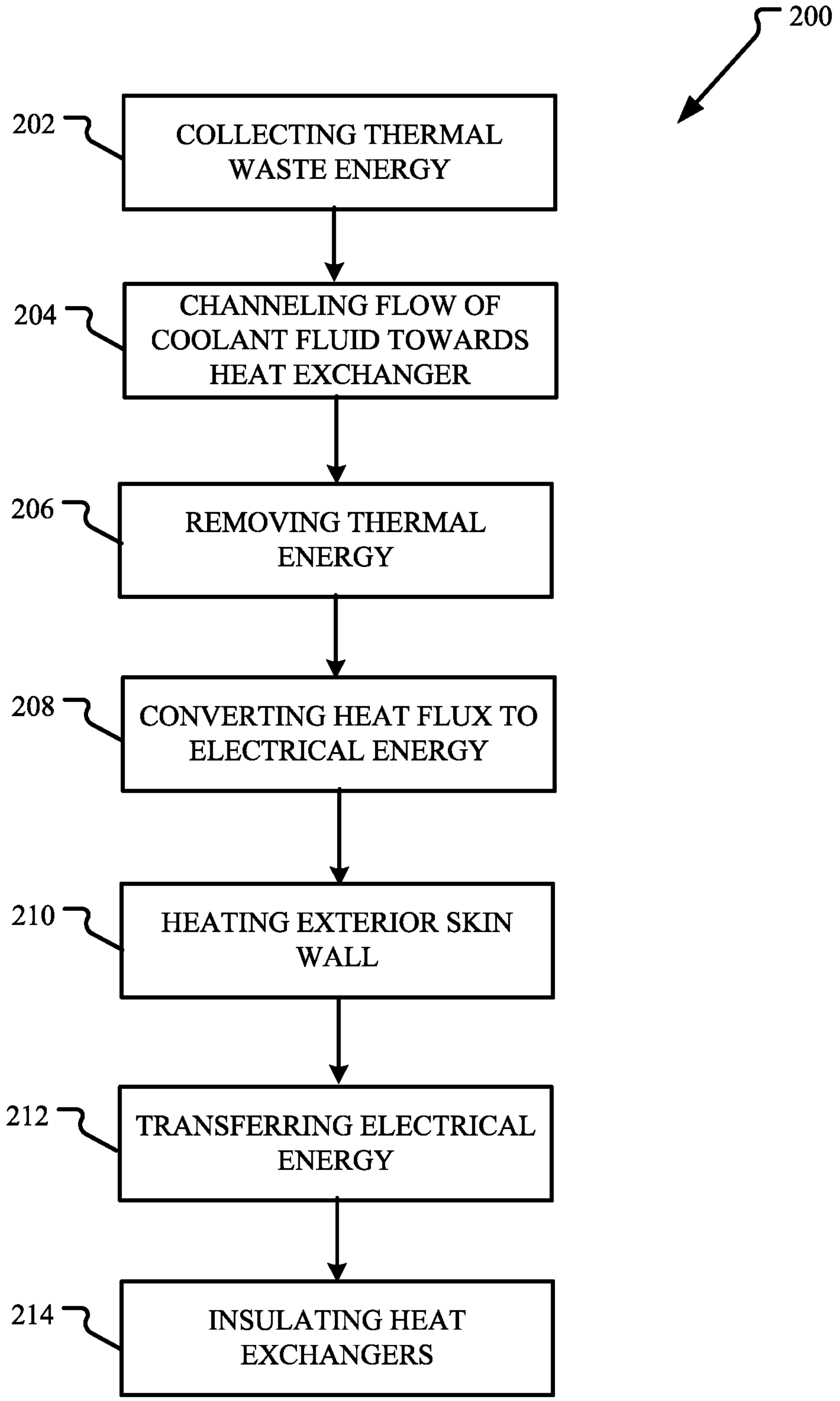
FIG. 4 is a flowchart illustrating a method of generating electrical energy from thermal waste energy and removing thermal waste energy in an aircraft.

FIG. 4 is a flowchart illustrating a method 200 of generating electrical energy from thermal waste energy and removing thermal waste energy in an aircraft. In aspects, the method 200 can be performed with one or more of the aircraft components described above in reference to FIGS. 1-3. The method 200 begins with collecting thermal waste energy from one or more thermal energy generating components on the aircraft in a flow of coolant fluid (operation 202). For example, a thermal management circuit is thermally coupled to the aircraft component and is used to extract heat into the flow of coolant fluid therein. In an aspect, the thermal energy generating component may be part of an electrical power circuit. In other aspects, the thermal energy generating component may be part of an hydraulic circuit, engine system, gear box system, or the like.

The flow of coolant fluid is channeled toward one or more heat exchangers downstream of the one or more thermal energy generating components (operation 204). The heat exchangers being coupled in thermal contact to an exterior skin wall of the aircraft. In an example, the heat exchangers are disposed adjacent to a leading edge of one or more control or propulsion surfaces of the aircraft. At the one or more heat exchangers, thermal energy is removed from the flow of coolant fluid (operation 206). For example, the thermal energy is transferred from the flow of coolant fluid to the exterior skin wall. Additionally, heat flux between the flow of coolant fluid and the atmosphere surrounding an outside surface of the exterior skin wall is converted to electrical energy via a thermoelectric generator (operation 208). The thermoelectric generator can include thermal interface material that extends between an inside surface of the exterior skin wall the heat exchangers.

In some examples, by transferring thermal energy from the flow of coolant fluid to the exterior skin wall during operation 206 the exterior skin wall is de-iced and/or anti-iced. In an aspect, the de-icing and/or anti-icing only occurs below predetermined altitudes and during ascent and descent operations of the aircraft. The de-icing and/or anti-icing can also include heating the exterior skin wall by an electric heater coupled in thermal contact to the exterior skin wall (operation 210). In some examples, the step of transferring thermal energy from the flow of coolant fluid to the exterior skin wall during operation 206 and the step of heating the exterior skin wall by the electric heater in operation 210 occur concurrently. This configuration reduces the amount of electric power required for de-icing and/or anti-icing operations.

The method 200 can also include transferring the electrical energy from the thermoelectric generator to an electrical power circuit of the aircraft (operation 212). By generating electrical power for the aircraft from waste thermal energy produced by operation of the aircraft, efficiency and performance of the aircraft are increased. Additionally or alternatively, the one or more heat exchangers can be insulated at the exterior skin wall of the aircraft (operation 214).

Figure 5:
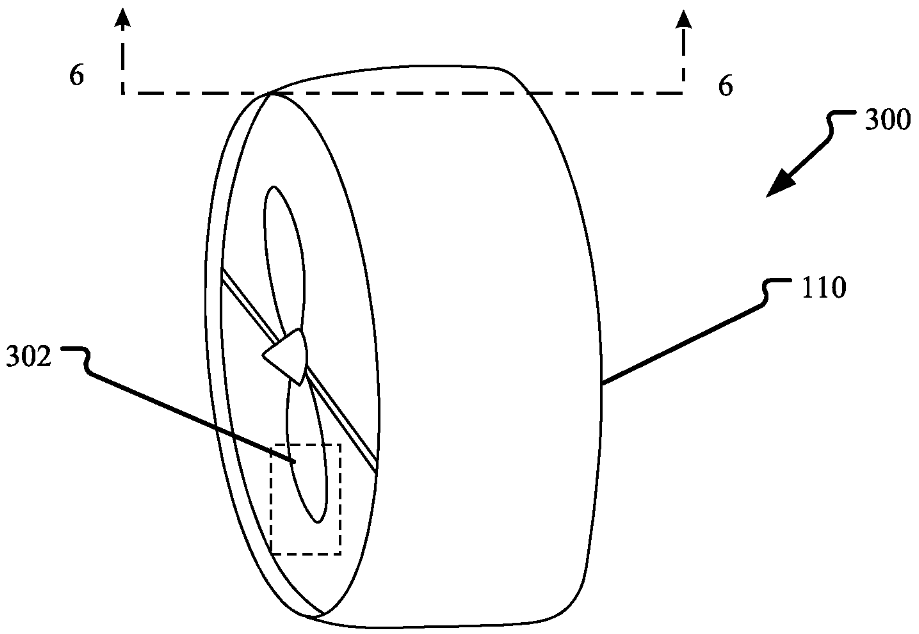
FIG. 5 is a perspective view of a ducted shroud.
Figure 6:
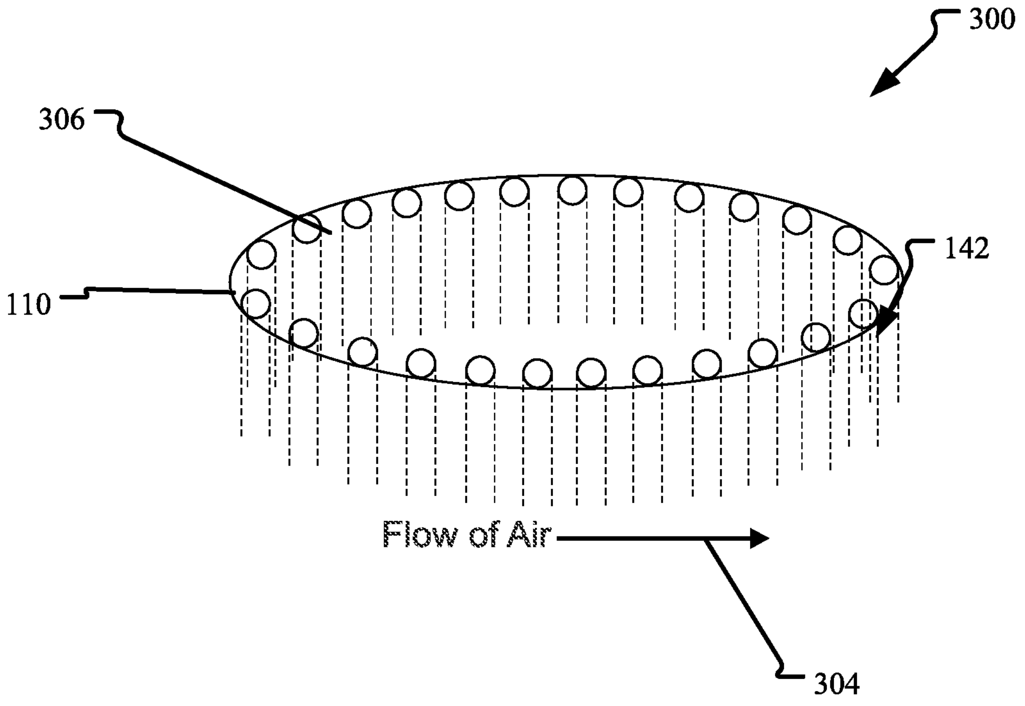
FIG. 6 is a cross-sectional view of the ducted shroud shown in FIG. 5 taken along line 6-6.

FIG. 5 is a perspective view of a ducted shroud 300. FIG. 6 is a cross-sectional view of the ducted shroud 300 shown in FIG. 5 taken along line 6-6. Referring concurrently to FIGS. 5 and 6, the ducted shroud 300 may house a fan 302 for a turbine engine and is a component of the aircraft 100 (shown in FIG. 1). The ducted shroud 300 includes the exterior skin wall 110 that is exposed to a flow of air 304 during operation and that may require de-icing and/or anti-icing. As such, one or more tubes 306 that are configured to house coolant fluid are routed to be in contact with the inside surface 142 of the exterior skin wall 110 for de-icing and/or anti-icing and heating the exterior skin wall 110. In other examples, one or more of the tubes 306 may be routed to be in contact with the exterior skin wall of a wing or a pylon as required or desired.

Figure 7:
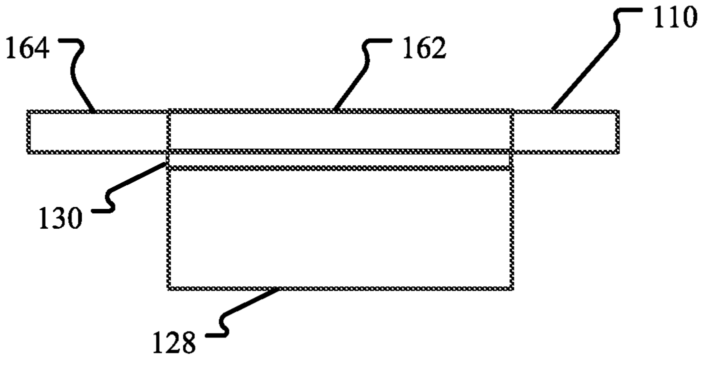
FIG. 7 is a schematic view of a thermoelectric generator of the thermal management circuit shown in FIG. 2.

FIG. 7 is a schematic view of the thermoelectric generator 130 of the thermal management circuit 126 (shown in FIG. 2). In this example, the thermoelectric generator 130 is disposed between the heat exchanger 128 and the exterior skin wall 110 and similar to the configuration shown in FIG. 2. The heat exchanger 128 includes liquid flow channels that dissipate heat towards a portion 162 of the exterior skin wall 110 that is heated for de-icing and/or anti-icing. In some aspects, an electric heater (not shown) may be additionally included. A portion 164 of the exterior skin wall 110 that de-icing and/or anti-icing is not required or desired and is cold may not include the thermoelectric generator 130.

Figure 8:
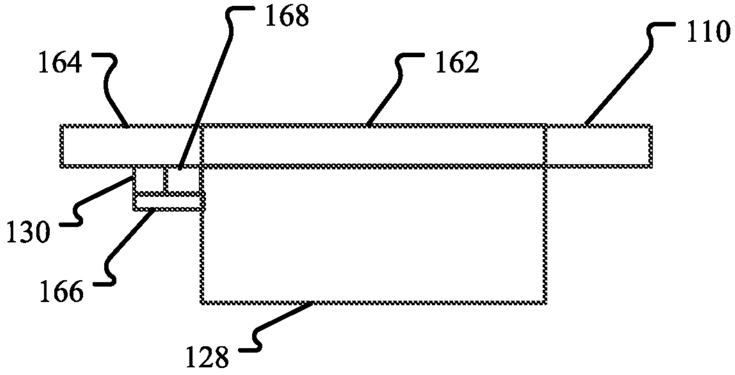
FIG. 8 is another schematic view of the thermoelectric generator of the thermal management circuit shown in FIG. 2.

FIG. 8 is another schematic view of the thermoelectric generator 130 of the thermal management circuit 126 (shown in FIG. 2). In this example, the heat exchanger 128 may be disposed directly adjacent to the heated portion 162 of the exterior skin wall 110 for de-icing and/or anti-icing. The heat exchanger 128 may include a feature 166 that protrudes from the heat exchanger 128 and is heated by coolant flow. The thermoelectric generator 130 is placed between the feature 166 and the cold portion 164 of the exterior skin wall 110. As such, the feature 166 extends outward from the heat exchanger 128 and the de-icing and/or anti-icing system. By placing the thermoelectric generator 130 adjacent to the heated portion 162 and in contact with the cold portion 164, the temperature delta that the thermoelectric generator 130 experiences can increase its efficiency. In an aspect, insulation 168 may be disposed between the thermoelectric generator 130 and the heat exchanger 128.

In the systems and methods described above, a heat exchanger and thermoelectric generator are used to remove thermal waste energy from a thermal management circuit and to generate electric power for the aircraft. The removal of thermal waste energy can act as a de-icing and/or anti-icing function for outside surfaces of the aircraft as required or desired during flight operation. When de-icing and/or anti-icing in not required or desired, the thermal waste energy can just be dissipated to the atmosphere. In an aspect, an electric heater may be used to augment de-icing and/or anti-icing functionality.

By using the thermal management circuit to reduce or prevent icing of the aircraft, a separate dedicated de-icing and/or anti-icing system is not necessary needed (e.g., a bleed air de-icing system or an electric heating system), or the size of the separate de-icing or anti-icing system can be reduced, thereby increasing aircraft efficiencies by reducing parasitic loads on engines and reducing weight. Additionally, by generating electrical energy from thermal waste energy, the aircraft is more efficient and power generation units can be reduced in size while increasing aircraft performance. The thermoelectric generator can also extend the range of an aircraft and make the aircraft more efficient.

This disclosure describes some examples of the present technology with reference to the accompanying drawings, in which only some of the possible examples were shown. Other aspects can, however, be embodied in many different forms and should not be construed as limited to the examples set forth herein. Rather, these examples were provided so that this disclosure was thorough and complete and fully conveyed the scope of the possible examples to those skilled in the art. Any number of the features of the different examples described herein may be combined into one single example and alternate examples having fewer than or more than all of the features herein described are possible. It is to be understood that terminology employed herein is used for the purpose of describing particular examples only and is not intended to be limiting. It must be noted that, as used in this specification, the singular forms "a," "an," and "the" include plural referents unless the context clearly dictates otherwise.

Although specific examples were described herein, the scope of the technology is not limited to those specific examples. One skilled in the art will recognize other examples or improvements that are within the scope of the present technology. Therefore, the specific structure, acts, or media are disclosed only as illustrative examples. Examples according to the technology may also combine elements or components of those that are disclosed in general but not expressly exemplified in combination, unless otherwise stated herein. The scope of the technology is defined by the following claims and any equivalents therein.

What is claimed is:

1. A system for generating electrical energy from thermal waste energy and removing thermal waste energy in an aircraft, the system comprising:

an electrical power circuit;

at least one thermal management circuit configured to channel a flow of coolant fluid that collects thermal waste energy from one or more thermal energy generating components consuming power from the electrical power circuit of the aircraft, wherein the one or more thermal energy generating components comprise electrical loads supplied by the electrical power circuit of the aircraft, wherein the electrical power circuit generates, controls, and distributes power to electrical loads on the aircraft;

one or more heat exchangers coupled in fluid communication with the at least one thermal management circuit and downstream from the one or more thermal energy generating components, wherein the one or more heat exchangers are coupled in thermal contact to an exterior skin wall of the aircraft and adapted to transfer thermal energy from the flow of coolant fluid to the exterior skin wall for removal from the at least one thermal management circuit; and a thermoelectric generator coupled in electric communication with the electrical power circuit and configured to convert heat flux between the flow of coolant fluid within the one or more heat exchangers and atmosphere surrounding an outside surface of the exterior skin wall into electrical energy for the electrical power circuit, wherein the thermoelectric generator comprises thermoelectric interface material extending between an inside surface of the exterior skin wall and the one or more heat exchangers.

2. The system of claim 1, further comprising an electric heater coupled in thermal contact to the exterior skin wall.

3. The system of claim 2, wherein the electric heater is disposed between the one or more heat exchangers and the inside surface of the exterior skin wall.

4. The system of claim 1, further comprising an insulating material layer, wherein the one or more heat exchangers and the thermoelectric generator being disposed between the insulating material layer and the inside surface of the exterior skin wall.

5. The system of claim 1, wherein the exterior skin wall of the aircraft is a leading surface of one or more control or propulsion surfaces of the aircraft.

6. The system of claim 1, wherein the thermoelectric generator further comprises a thermoelectric module formed by the thermoelectric interface material and adapted to directly generate the electrical energy from the heat flux within the thermoelectric interface material, the thermoelectric module coupled to an electrical power circuit of the aircraft.

7. The system of claim 6, wherein the thermoelectric module is coupled to the electrical power circuit via integrated or printed electronic wiring.

8. The system of claim 6, further comprising an electric heater coupled in thermal contact to the exterior skin wall and operably coupled to the electrical power circuit.

9. The system of claim 1, wherein the at least one thermal management circuit comprises tubing for the flow of coolant fluid, and wherein at least a portion of the tubing between the one or more thermal energy generating components and the one or more heat exchangers is routed along at least a portion of one or more of a ducted shroud, a pylon, and a wing of the aircraft and thermally coupled thereto.

10. A method of generating electrical energy from thermal waste energy and removing thermal waste energy in an aircraft, the method comprising:

collecting in a flow of coolant fluid thermal waste energy from one or more thermal energy generating components operating on power from an electrical power circuit of the aircraft, wherein the one or more thermal energy generating components comprise electrical loads supplied by the electrical power circuit of the aircraft, wherein the electrical power circuit generates, controls, and distributes power to electrical loads on the aircraft;

channeling the flow of coolant fluid towards one or more heat exchangers downstream of the one or more thermal energy generating components, wherein the one or more heat exchangers are coupled in thermal contact to an exterior skin wall of the aircraft;

removing thermal energy from the flow of coolant fluid at the one or more heat exchangers by transferring thermal energy from the flow of coolant fluid to the exterior skin wall;

converting heat flux between the flow of coolant fluid and atmosphere surrounding an outside surface of the exterior skin wall to electrical energy via a thermoelectric generator, wherein the thermoelectric generator includes thermoelectric interface material extending between an inside surface of the exterior skin wall and the one or more heat exchangers; and transferring the electrical energy from the thermoelectric generator to the electrical power circuit of the aircraft.

11. The method of claim 10, further comprising reducing or preventing ice formation at the exterior skin wall by transferring thermal energy from the flow of coolant fluid to the exterior skin wall.

12. The method of claim 11, wherein reducing or preventing ice formation at the exterior skin wall also includes heating the exterior skin wall by an electric heater coupled in thermal contact to the exterior skin wall.

13. The method of claim 12, wherein the step of transferring thermal energy from the flow of coolant fluid to the exterior skin wall and the step of heating the exterior skin wall by the electric heater occur concurrently.

14. The method of claim 10, further comprising transferring the electrical energy from the thermoelectric generator to an electrical power circuit of the aircraft.

15. The method of claim 10, further comprising insulating the one or more heat exchangers at the exterior skin wall of the aircraft.

16. A system for reducing ice formation on an aircraft, the system comprising:

an electrical power circuit;

at least one thermal management circuit configured to channel a flow of coolant fluid that collects thermal waste energy from one or more thermal energy generating components consuming power from the electrical power circuit of the aircraft, wherein the one or more thermal energy generating components comprise electrical loads supplied by the electrical power circuit of the aircraft, wherein the electrical power circuit generates, controls, and distributes power to electrical loads on the aircraft;

one or more heat exchangers coupled in fluid communication with the at least one thermal management circuit and downstream from the one or more thermal energy generating components, wherein the one or more heat exchangers are coupled in thermal contact to an exterior skin wall of the aircraft and adapted to transfer thermal energy from the flow of coolant fluid to the exterior skin wall for removal from the at least one thermal management circuit, and wherein the aircraft is configured to operate in an ice reduction configuration that uses the transfer of thermal energy from the flow of coolant fluid to reduce or prevent ice formation at the exterior skin wall; and a thermoelectric generator coupled in electric communication with the electrical power circuit and configured to convert heat flux between the flow of coolant fluid within the one or more heat exchangers and atmosphere surrounding an outside surface of the exterior skin wall into electrical energy for the electrical power circuit, wherein the thermoelectric generator comprises thermoelectric interface material extending between an inside surface of the exterior skin wall and the one or more heat exchangers.

17. The system of claim 16, further comprising an electric heater coupled in thermal contact to the exterior skin wall, wherein the electric heater is configured to augment the reduction or prevention of ice formation at the exterior skin wall.

18. The system of claim 17, wherein the thermoelectric generator further comprises a thermoelectric module formed by the thermoelectric interface material and adapted to directly generate the electrical energy from the heat flux within the thermoelectric interface material, the thermoelectric module coupled to the electric heater.

19. The system of claim 16, wherein the exterior skin wall of the aircraft is a leading surface of one or more control or propulsion surfaces of the aircraft.

20. The system of claim 16, wherein the ice reduction configuration occurs during ascent and descent operations of the aircraft, and wherein outside of the ice reduction configuration, the transfer of thermal energy from the flow of coolant dissipates heat from the at least one thermal management circuit.

* * * * *